US012710493B2

(12) United States Patent
Ouzounov et al.

(10) Patent No.: US 12,710,493 B2
(45) Date of Patent: Aug. 18, 2026

(54) MAGNETIC RESONANCE RECEIVER COIL ARRAY WITH SENSOR NODE

(71) Applicant: KONINKLIJKE PHILIPS N.V., Eindhoven (NL)

(72) Inventors: Sotir Filipov Ouzounov, Eindhoven (NL); Filips van Liere, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 156 days.

(21) Appl. No.: 18/849,578

(22) PCT Filed: Mar. 22, 2023

(86) PCT No.: PCT/EP2023/057336

§ 371 (c)(1),
(2) Date: Sep. 23, 2024

(87) PCT Pub. No.: WO2023/186657

PCT Pub. Date: Oct. 5, 2023

(65) Prior Publication Data

US 2025/0224469 A1 Jul. 10, 2025

(30) Foreign Application Priority Data

Mar. 28, 2022 (EP) .................................... 22164650

(51) Int. Cl.

| | |
|---|---|
| ***G01R 33/36*** | (2006.01) |
| ***G01R 33/48*** | (2006.01) |
| ***G01R 33/567*** | (2006.01) |

(52) U.S. Cl.
CPC ..... *G01R 33/3621* (2013.01); *G01R 33/4808* (2013.01); *G01R 33/5673* (2013.01)

(58) Field of Classification Search
CPC ............ G01R 33/3621; G01R 33/4808; G01R 33/5673; G01R 33/3685; G01R 33/3415; A61B 5/318; A61B 5/7289
See application file for complete search history.

(56) References Cited

U.S. PATENT DOCUMENTS 6,501,979 B1 12/2002 Manning et al.
6,591,128 B1 7/2003 Wu et al.
(Continued)

FOREIGN PATENT DOCUMENTS

EP 3841972 A1 6/2021

OTHER PUBLICATIONS

International Search Report and Written Opinion from PCT/EP2023/057336 mailed Jun. 1, 2023.
(Continued)

*Primary Examiner* — G.M. A Hyder

(57) ABSTRACT

The invention relates to the field of magnetic resonance (MR) receiver coil arrays (1), and in particular to a magnetic receiver coil array (1) with an additional sensor node (3). The sensor node (3) comprises a sensor (23) for gathering measurement data and a sensor signal acquisition circuit (25), wherein the sensor signal acquisition circuit (25) is configured to digitize the gathered measurement data. The sensor signal acquisition circuit (25) is connected to the digital amplifier signal acquisition circuit (16) via a first digital interface (27). The sensor signal acquisition circuit (25) is configured to link the digitized measurement data from the sensor signal acquisition circuit (25) to the digital amplifier (4) via the first digital interface (27), wherein the digital amplifier (4) is configured to combine the digitized measurement data from the sensor signal acquisition circuit (25) and the digital amplified MR signal. The MR receiver coil array (1) comprising a merger circuit (6), wherein the merger circuit (6) is configured to receive the combined
(Continued)

digital MR signal and the digitized measurement data from the digital amplifier (4) by a second digital interface (28) and to output the combined data to a back-end of the MR imaging system. Based on the additional data thus obtained by means of the sensors (23), MR imaging can be improved. The invention relates also to a MR imaging device and a computer program product.

15 Claims, 4 Drawing Sheets

(56) References Cited

U.S. PATENT DOCUMENTS

| | | | |
|---|---|---|---|
| 2015/0150511 A1 | 6/2015 | Van Helvoort | |
| 2018/0055406 A1 | 3/2018 | Mandal et al. | |
| 2020/0025845 A1 | 1/2020 | Ferguson et al. | |
| 2023/0037196 A1* | 2/2023 | Leussler | A61B 5/721 |
| 2023/0128603 A1* | 4/2023 | Vernickel | G01R 33/36 324/318 |

OTHER PUBLICATIONS

Francesca Romana Parente et al., "An Electronic System for the Contactless Reading of ECG Signals" Sensors 2017 17, 2474; doi:10.3390/s17112474.

Jeong Su Lee et al., "Capacitive Measurement of ECG for Ubiquitous Healthcare" Annals of Biomedical Engineering, vol. 42, No. 11, Nov. 2014 ( 2014) pp. 2218-2227 DOI: 10.1007/s10439-014-1069-6.

Dziuda "Fiber-optic sensors for monitoring patient physiological parameters: A review of applicable technologies and relevance to use during magnetic resonance imaging procedures" Journal of Biomedical Optics Jan. 2015.

* cited by examiner 21
22
12
12
3
27
11
23, 25
24
4
19
20
19
18
18
17
17
15
15
16
14
14
10
10
2
2

MAGNETIC RESONANCE RECEIVER COIL ARRAY WITH SENSOR NODE

CROSS REFERENCE TO RELATED APPLICATIONS

This application is a U.S. national phase application of International Application No. PCT/EP2023/057336 filed on Mar. 22, 2023, which claims the benefit of EP Application Serial No. 22164650.8 filed Mar. 28, 2022 and is incorporated herein by reference.

FIELD OF THE INVENTION

The invention relates to the field of magnetic resonance receiver coil arrays, and in particular to a magnetic receiver coil array with an additional sensor node.

BACKGROUND OF THE INVENTION

Electrocardiogram (ECG) measurements are done during a magnetic resonance (MR) scan to monitor electrophysiology and to provide timing information for the heart cycle that in turn is used to trigger the MR scan. The triggering is mandatory for imaging of the heart and facilitates image quality improvement for all other organs. Currently, the ECG measurement during MR scan is done with a dedicated ECG device that is fully or partially in the MR scanning bore. The signal acquisition is done with a set of wet electrodes that are attached to the patient during the scan preparation. This requires a separate step that has to be performed by trained personnel to guarantee correct position and attachment of the ECG electrodes to the patient. Usage of ECG in the MR bore is very complicated due to the requirement for full MR compatibility of the ECG measurement and due to the mutual impacts on the quality of the gathered signals. For example, the ECG signal is distorted during magnetic field gradient switching due to EMI and due to vibrations of the electronics. The ECG cables can also adversely impact the MR scan. ECG signals appear on the body as surface potentials resulting from the electric activity of the heart. It can be desirable to obtain diagnostic quality ECG signals while a patient is being monitored in a magnetic resonance imaging (MRI) system.

Current ECG with wet electrodes is independent from the magnetic resonance imaging (MRI) system and only allows gating of the MR sequence in respect to an averaged heart rate obtained from the ECG measurement. Such ECG gating provides information regarding what part of the heart cycle the heart is at for purposes of triggering an MR image to be taken at the desired point in the heart cycle. Furthermore, it is not presently possible to obtain adequate ECG quality on standard 1.5 T or higher MRI systems. In addition, ECG triggering can also be difficult on standard 3 T or higher MRI systems. Accordingly, there is currently no diagnostic quality ECG system that can be used in the MRI system. Currently ECG measurements in the MR bore are done with a separate ECG system that is placed on the patient in a separate step. The ECG uses only a few electrodes (to limit the cable count). Further wet ECG electrodes are used that are connected with long cables to the sensor electronics. Patient preparation for ECG measurement is lengthy and not sufficiently robust process. Similar reasoning is applicable to all types of ExG measurements and, to all type of measurements that are relevant during MR signal acquisition. Most of them are not done today due the high complexity and cost associated with their introduction in the coil.

EP3841972A1 discloses a magnetic resonance (MR) imaging system with an integrated vital signs detector for the detection of vital signs of a patient within the magnetic resonance (MR) imaging system.

SUMMARY OF THE INVENTION

It is an object of the invention to enhance the MR image quality or system maintenance by providing additional data by an additional sensor node.

The invention is defined by the independent claims. Preferred embodiments of the invention are described in the dependent claims.

A first aspect of the invention provides a magnetic resonance (MR) receiver coil array for an MR imaging system, the MR receiver coil array comprising:

- at least one radio frequency (RF) receiver antenna,
- at least one digital amplifier signal acquisition circuit, comprising a digital amplifier, wherein the digital amplifier signal acquisition circuit is configured for receiving an MR signal from the RF receiver antenna and outputting a digital amplified MR signal,
- at least one sensor node comprising a sensor for gathering measurement data, the sensor node further comprising a sensor signal acquisition circuit, wherein the sensor signal acquisition circuit is configured to digitize the gathered measurement data, wherein the sensor signal acquisition circuit is connected to the digital amplifier signal acquisition circuit via a first digital interface, wherein the sensor signal acquisition circuit is configured to link the digitized measurement data from the sensor signal acquisition circuit to the digital amplifier via the first digital interface, wherein the digital amplifier is configured to combine the digitized measurement data from the sensor signal acquisition circuit and the digital amplified MR signal, wherein
- the MR receiver coil array comprises a merger circuit, wherein the merger circuit is configured to receive the combined digital amplified MR signal and the digitized measurement data from the digital amplifier by a second digital interface and to output the combined data to a back-end of the MR imaging system or a digital data processor. In case of a plurality of digital amplifiers, sensors of different types, and a plurality of identical sensors nodes, the merger can recombine the data per data type e.g., RF data, ECG data or other sensor data into a dedicated data stream and provide the data stream to the back-end. Alternatively, a specific data processing e.g., ECG recombination can also happen in or close to the merger in the coil assembly.

The invention provides additional data with additional measurements by the sensor node that can be performed during an MR examination. Additional measurements can be understood as any measurement that is different from MR signal acquisition but can improve MR image quality or system maintenance or acquire additional patient information by providing additional data to the user.

In respect to the currently used solutions, the invention brings major system, capability and procedural improvements. It is particularly advantageous that only short cables or even no cables may need to be used for the measurements. In this way, major design and safety concern are largely eliminated. Furthermore, no dedicated infrastructure on PCB and coil assembly level is needed to perform the measurements with the sensor node. Power supplies and cables, data transport cables and physical carrier (PCB) are already provided by the digital amplifier signal acquisition circuit as part of the digital amplifier for RF data acquisition. No dedicated patient preparation or scan preparation step is needed as the measurement can be built-in the MR coil and enabled by the operator via the software controlling the signal acquisition with the coil. There is no real limitation for the number of sensors that can be used. As a result, very high-quality measurements can be achieved in a very safe, robust and cost-efficient way.

As an additional advantage, the gathered sensory data is time aligned in each digital amplifier with main RF data. The main RF data could be of any data that is related to the RF (radiofrequency) acquisition, transformation, and reconstruction. This could lead to any component used to construct the B0 and B1 fields. As a non-limiting example, the main RF data could be the data of the MR signal received by the RF receiver antenna in the digital amplifier. This allows time correlation of the sensor measurements with the RF imaging sequence and in this way enables time adaptation for optimal alignment of events.

In an advantageous embodiment of the invention, the sensor has a common ground with the digital amplifier.

In an advantageous embodiment of the invention, the sensor of the sensor node is configured to detect a physiological measured value of the patient to be examined.

In an advantageous embodiment of the invention, the sensor is an electrophysiology sensor or a motion sensor.

In an advantageous embodiment of the invention, the sensor is a capacitive electrophysiology sensor comprising at least one capacitive electrode.

In an advantageous embodiment of the invention, the sensor is configured to detect a measured value of the environment in which the MR signal is gathered and/or a measured value of the MR imaging system.

In an advantageous embodiment of the invention, the MR receiver coil array comprises a plurality of RF receiver antennas with a plurality of digital amplifier signal acquisition circuits and a plurality of sensors with a plurality of sensor signal acquisition circuits, wherein the sensors, several sensors of the same type, or several sensors of different types, are configured for providing data to one or a plurality of digital amplifiers, wherein the digital amplifier is configured to collect the measurement data from multiple sensors of same or different type and to facilitate the transport of a grouped sensory data to the merger circuit, wherein the merger circuit is configured to combine the data from the individual sensor types into data channels and to transfer data to the back-end of the MR imaging system as a single or multiple data channels.

In an advantageous embodiment of the invention, the MR receiver coil array comprises different type of sensors, wherein the measurement data of the different type of sensors is transported to the merger circuit, wherein the merger circuit is configured to merge the measurement data from the different types of sensors per sensor type.

A second aspect of the invention provides a method for acquiring measurement data with a sensor node in a magnetic resonance (MR) receiver coil array, the method comprising:

- providing an MR receiver coil array as described or claimed herein with at least one sensor node comprising a sensor for acquiring measurement data,
- gathering of measurement data by means of the sensor where the data can be temporally stored in a local memory,
- digitizing the gathered measurement data by means of the sensor signal acquisition circuit,
- linking the data to the digital amplifier via the first digital interface,
- combining the measurement data and the digital amplified MR signal received by the RF receiver antenna in the digital amplifier,
- transferring the combined data to the merger circuit via the second digital interface,
- outputting the combined data to a back-end of an MR imaging system by the merger circuit.

In an advantageous embodiment of the invention, the digital amplifier comprises a digital controller, wherein the step of combining the measurement data and the digital amplified MR signal received by the RF receiver antenna in the digital amplifier comprises:

- initiating a sensor measurement and acquiring sensor data by the digital controller, where the data can be temporally stored in a local memory,
- putting the measurement data in a communication layer of the digital amplifier in a time-interleaved fashion together with the digitized MR signal.

In an advantageous embodiment of the invention, the MR receiver coil array comprises a plurality of RF receiver antennas with a plurality of digital amplifier signal acquisition circuits and a plurality of sensors with a plurality of sensor signal acquisition circuits, wherein the sensors, several sensors of the same type or several sensors of different types are configured for providing data to one or a plurality of digital amplifiers, and wherein combining the measurement data and the digital amplified MR signal received by the RF receiver antenna in the digital amplifier, comprises:

- collecting the measurement data from multiple sensors of same or different type by the digital amplifier and facilitating the transport of grouped sensory data to the merger circuit,
- combining the data from the individual sensor types into data channels by the merger circuit and transferring data to the back-end of the MR imaging system as a single or multiple data channels.

In an advantageous embodiment of the invention, the gathered sensory data is time aligned in each digital amplifier with the main RF data.

The invention further relates to a computer program product comprising instructions to cause a processor, by means of any magnetic resonance (MR) receiver coil array as described or claimed herein, to execute any method as described or claimed herein. The computer program may be downloaded from a server (e.g., using the internet) or stored on a storage medium.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
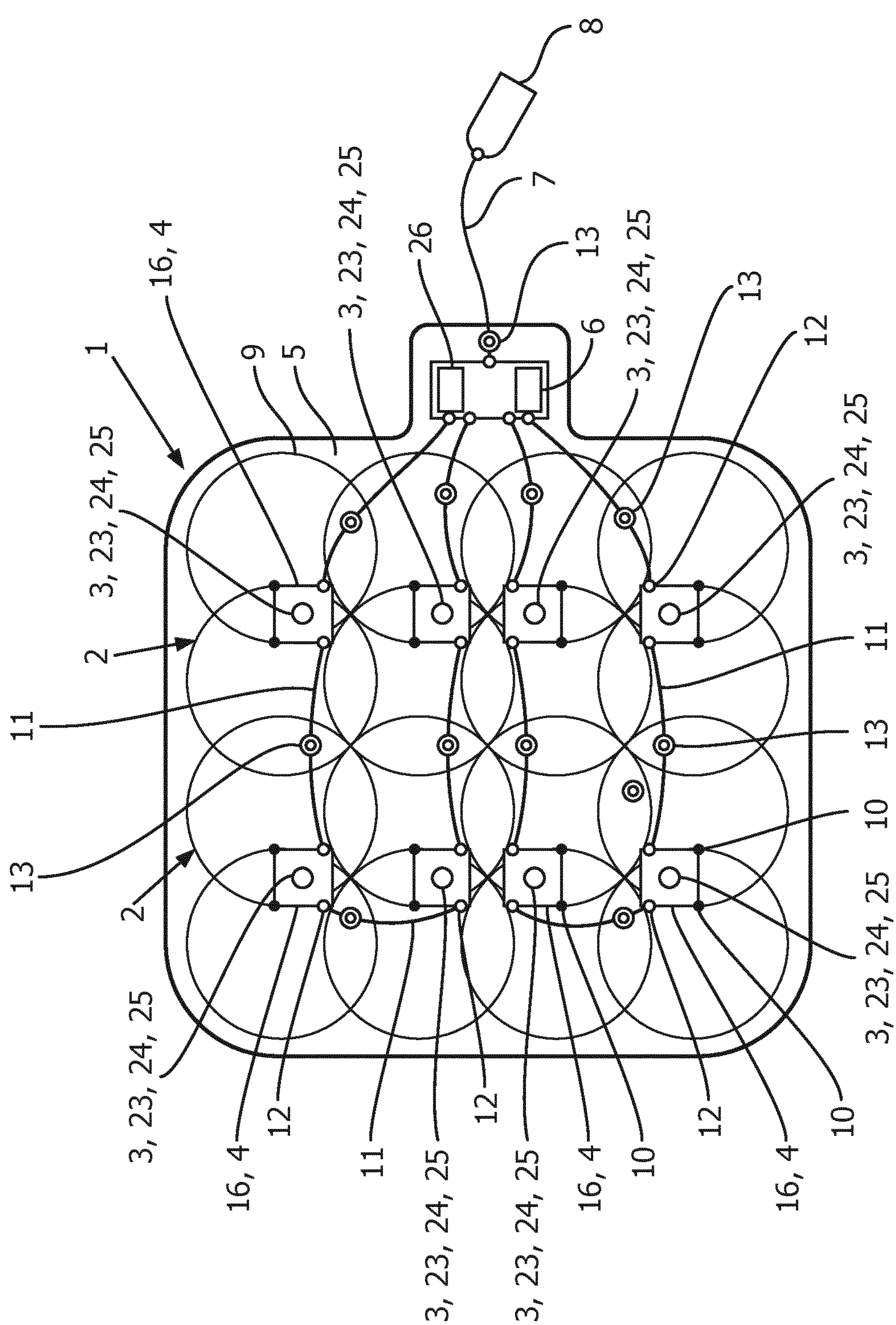
FIG. 1 schematically depicts an MR receiver coil array comprising multiple digital RF amplifier and multiple sensors nodes according to an embodiment of the invention, FIG. 2 schematically depicts a digital amplifier signal acquisition circuit with a sensor node according to an embodiment of the invention, FIG. 3 schematically depicts a digital amplifier with an ECG sensor connected to the digital amplifier according to an embodiment of the invention.

FIG. 1 schematically depicts an MR receiver coil array 1 comprising multiple digital amplifiers and multiple sensor nodes 3 according to an embodiment of the invention. FIG. 1 shows an example of a 16-channel MR receiver coil array 1. The MR receiver coil array 1 consists of 16 radio frequency (RF) receive antennas 2, with 2 of each of the (RF) receive antennas 2 interconnected with a digital amplifier 4. FIG. 1 shows The MR receiver coil array 1 is housed in coil array housing 5 and can be connected to the back-end of the MR imaging system, for example, by means of a coil cable 7 and a coil plug 8. Four digital amplifiers 4 are interconnected to form a ring network of digital amplifiers 4. The digital amplifiers 4 are interconnected by means of a digital network 11 and connected to the digital network 11 via digital network connections 12. For blocking high frequency noise in galvanic cables common mode RF chokes 13 can be introduced in the digital network 11. If the digital network is optical common mode RF chokes 13 are not needed. Each of the digital amplifiers 4 include a digital amplifier signal acquisition circuit 16, wherein the digital amplifier signal acquisition circuit 16 is configured for receiving an MR signal from the RF receiver antenna 2 and outputting a digital amplified MR signal. The network of digital amplifiers 4 forwards the digital amplified MR signals to a merger circuit 6 where the data from the individual channels is combined to a single data stream. The single data stream is further transmitted via the coil cable 7 to the backend of the MR imaging system where the image reconstruction is done. Alternatively, partial or full image reconstruction can be done in a digital logic located in or next to the merger circuit 6. The MR receiver coil array 1 shown in FIG. 1 further comprises eight additional sensor nodes 3. Each sensor node 3 comprises a sensor 23 for gathering additional measurement data. Additional measurement data means any data obtained by a data measurement other than MR signal acquisition. The additional measurement data can enhance the MR image quality or system maintenance or be used to collect additional clinically relevant patient data. For example, the data can be about the patient being scanned e.g., electrophysiology and motion data or data about the scan environment e.g., temperature or vibrations or system parameters e.g., temperature of various key devices or the local magnetic field strength or field dynamics of the MR imaging system. Therefore, in an embodiment of the invention the sensor 23 can be e.g., an electrophysiology sensor to detect electrophysiological signals or a motion sensor for detecting body motion of the patient to be examined. All these sensors 23 and measurements provide valuable results to improve MR imaging or the diagnostic capabilities of the system. The sensor nodes 3 can be e.g., configured to detect a physiological measured value of the patient to be examined. In particular, the sensors 23 may be designed to measure ExG signals e.g., ECG and EEG signals. ECG measurements during an MR scan are mandatory measurements in some clinical settings. EEG measurements are a growing method for MR brain research. Furthermore, each sensor node 23 has a sensor signal acquisition circuit 25, wherein the sensor signal acquisition circuit 25 is configured to digitize the gathered measurement data. The sensor signal acquisition circuit 25 is connected to the digital amplifier signal acquisition circuit 16 of the digital amplifier 4 via a first digital interface 27. In an embodiment of the invention one digital amplifier 4 can collect the data from multiple sensor nodes 3. In a specific embodiment the sensor network makes use of the common ground of the MR sensor network. Further, a dedicated common reference ExG electrode 26 is located in the MR receiver coil array 1. The ExG measurement can use dry or capacitive electrodes 24 that are build-in the MR receiver coil array 1 to touch or reach proximity with the patient body when the MR receiver coil array 1 is placed on the patient.

Figure 2:
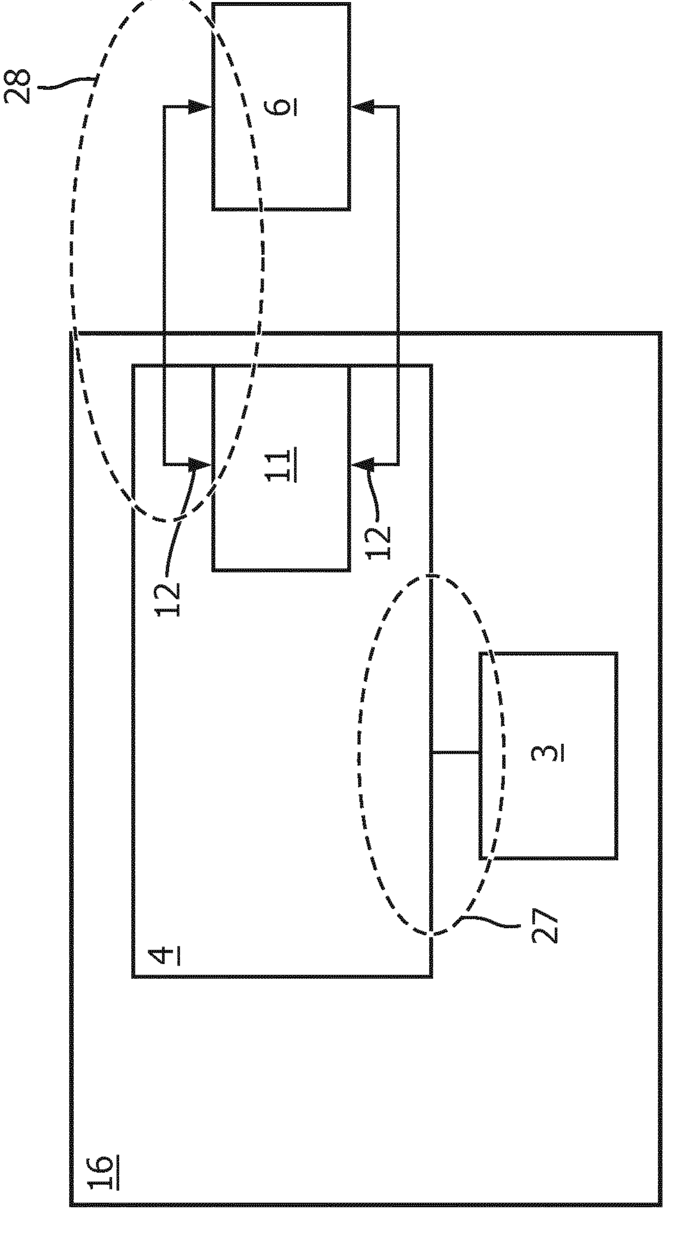

FIG. 2 schematically depicts a digital amplifier signal acquisition circuit 16 with a sensor node 3 according to an embodiment of the invention. The digital amplifier signal acquisition circuit 16 comprises a digital amplifier 4 for amplifying received MR signal from the RF receiver antenna 2 and outputting a digital amplified MR signal. The sensor node 3 is connected to the digital amplifier 4 via a first digital interface 27. The data from the sensor node 3 is put in a communication layer in a time-interleave fashion with the MRI data. The data is made available to a digital network 11. The digital network 11 transmits the data to a merger circuit 6 via a second digital interface 28. In the merger circuit 6, the data from a designated set of sensor nodes is combined to create a combined signal per type of data, e.g., MR, motion or electrophysiology sensor data.

Figure 3:
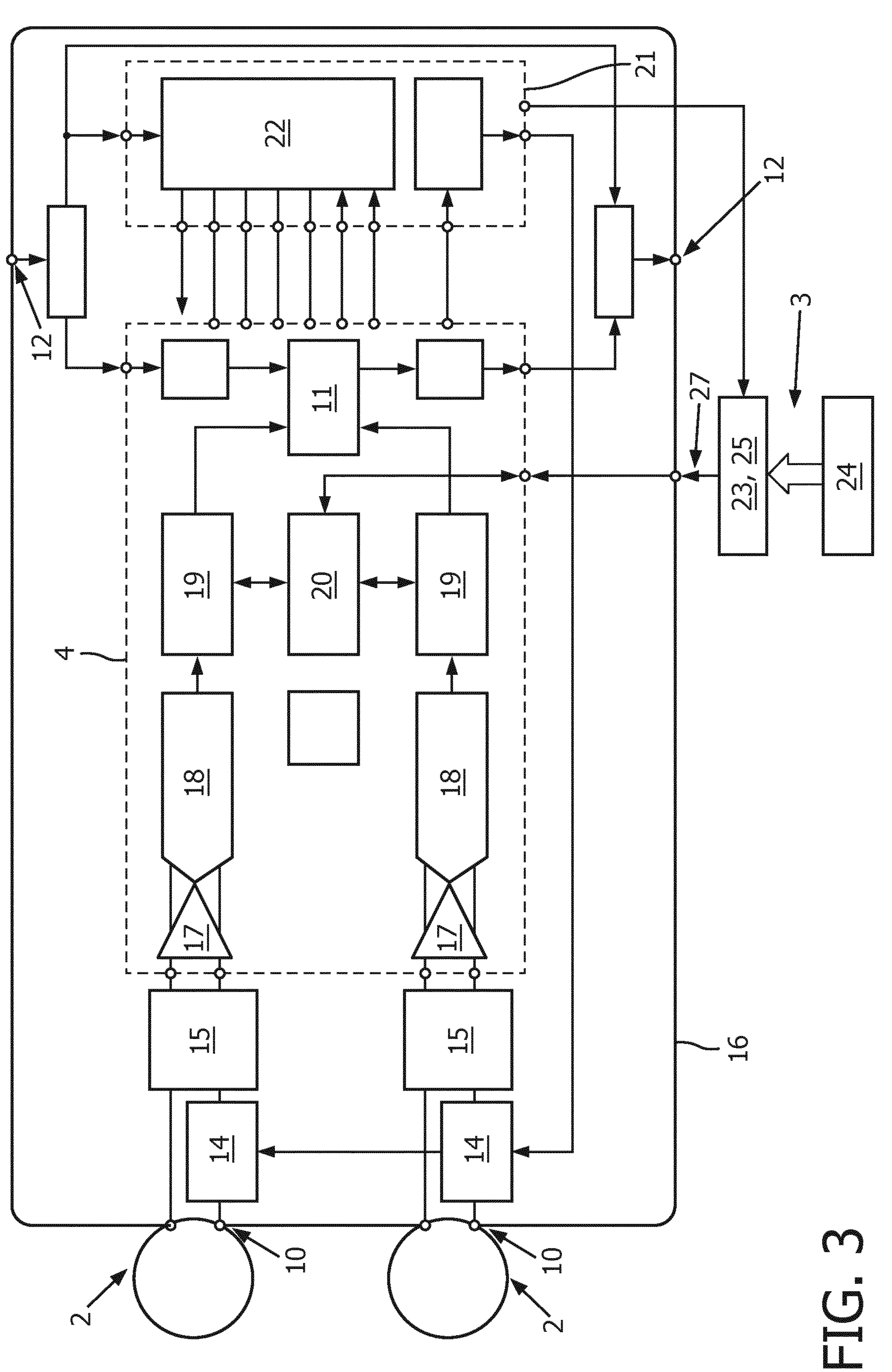

FIG. 3 depicts an electronic signal acquisition circuit 16 with a digital amplifier 4 with an ECG sensor 23 connected to it according to an embodiment of the invention. FIG. 3 shows two RF receive antennas 2, each connected to a low noise amplifier 17 via a detune circuit 14 and a matching circuit 15. By means of an analog-to-digital converter 18 and a digital signal processor 19, respectively, the signals are digitized and made available to the digital network 11. Furthermore, the digital amplifier 4 comprises a power supply 21 with a DC-DC converter 22. In the embodiment shown in FIG. 3, an ECG sensor 23 comprising an ECG electrode 24 is shown. The ECG sensor 23 is supplied from the power supply 21. Further it receives commands from and returns data to the amplifier. In particular to the digital controller 20 that can be realized as a microprocessor.

The ECG data as gathered in each sensor node 3 is locally digitized and linked to the digital amplifier 4 via a first digital interface 27. For example, an inter-integrated circuit (I2C) or a serial peripheral interface (SPI) can be provided as the first digital interface 27. The digital amplifier 4 also includes a digital controller 20. Through the digital controller 20 the ECG data is put in the communication layer in a time-interleave fashion with the MRI data and further transmitted to the merger circuit 6 via a second digital interface 28. In the merger circuit 6 the ECG data is referred to the common mode or ground ECG electrode and combined in an ECG data stream. It might be important to have two ECG channels per digital amplifier node to be able to realize differential ECG measurement. Further, each node might also create a local reference with a dedicated electrode e.g., dry or capacitive. The data stream is transmitted via the coil cable 7 to the back-end of the MR imaging device for ECG waveform extraction. Alternatively, the ECG extraction can be done in or next to the merger device such that only the recombined ECG signal is provided to the back-end. The implementation as described, is collecting and feeding data to the back-end of the MR imaging system. This allows easy triggering of the MRI scan based on the characteristics of the incoming ECG data. The ECG measurement is controlled via the back-end through the data transport layer that sends control data to the digital controller 20. The digital controller 20 may use a dedicated software routine that controls the ECG measurement and is able to control the ECG data acquisition via the digital interface 27.

Figure 4:
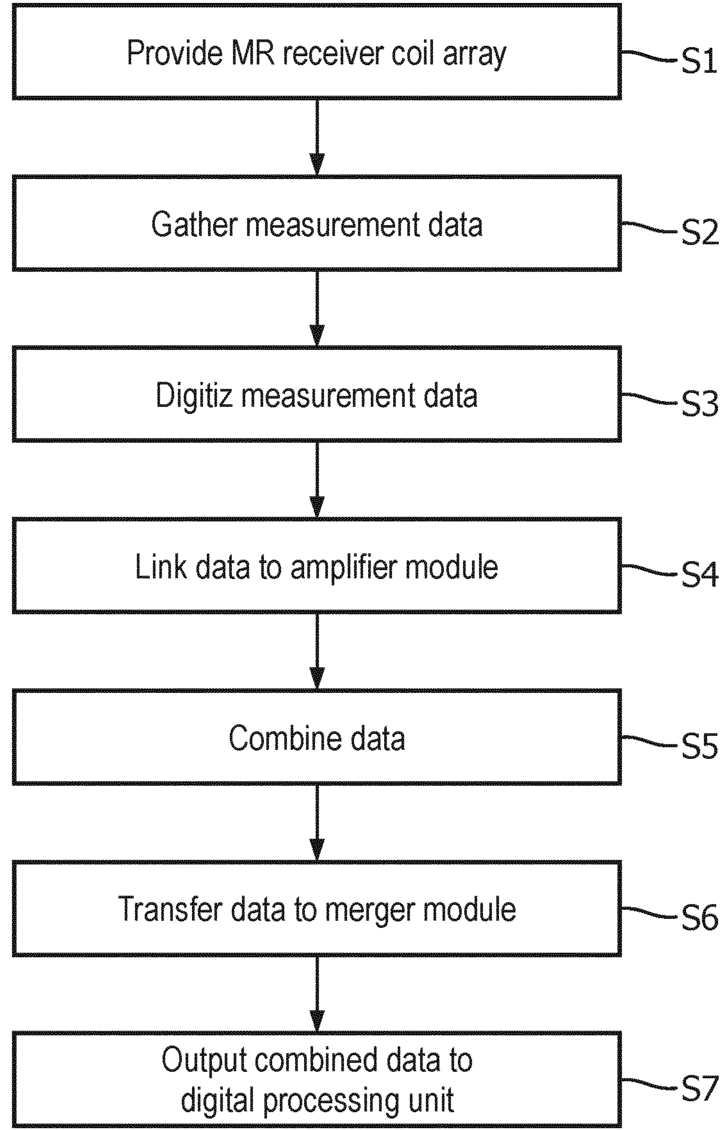
FIG. 4 shows a flow chart of a method for acquiring measurement data with a sensor node in a magnetic resonance (MR) receiver coil array according to an embodiment of the invention.

FIG. 4 shows a flow chart of a method for acquiring measurement data with a sensor node 3 in a magnetic resonance (MR) receiver coil array 1 according to an embodiment of the invention. In step S1, a magnetic resonance (MR) receiver coil array 1 is provided with at least one sensor node 3 comprising a sensor 23 for acquiring measurement data. In step S2, measurement data is gathered by means of the sensor 23. In an embodiment of the invention each sensor can be individually enabled by the user and can receive commands controlling the data acquisition. In step S3, the gathered measurement data is digitized by means of the sensor signal acquisition circuit 25. In step S4 the data is linked to the digital amplifier 4 via the digital interface 27. In step S4, the measurement data and the digital amplified MR signal received by the RF receiver antenna 2 are combined in the digital amplifier 4. In step S5, the combined data is transferred to the merger circuit 6 via a second digital interface 28. In step S6 the combined data is output to a back-end of an MR imaging system by the merger circuit 6. In an embodiment of the invention the digital amplifier 4 comprises a digital controller 20, wherein the step of combining the measurement data and the digital amplified MR signal received by the RF receiver antenna 2 in the digital amplifier 4 comprises the step of putting the measurement data in a communication layer in a time-interleave fashion together with the digital amplified MR signal by the digital controller.

In another embodiment of the invention, the MR receiver coil array 1 comprises a plurality of RF receiver antennas 2 with a plurality of digital amplifier signal acquisition circuits 16 and a plurality of sensors 23 with a plurality of sensor signal acquisition circuits 25, wherein the sensors 23 are arranged in channels, wherein the step of combining the measurement data and the digital amplified MR signal received by the RF receiver antenna in the digital amplifier, comprises the steps of collecting and combining the measurement data from multiple channels and transferring the grouped channels to the merger circuit 6, combining the data from the individual channels to a single data stream, transferring the single data stream to the back-end of the MR imaging system or just a digital data processor.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Measures recited in mutually different dependent can advantageously be combined. Any reference signs in the claims should not be construed as limiting the scope. Further, for the sake of clearness, not all elements in the drawings may have been supplied with reference signs.

REFERENCE SYMBOL LIST

MR receiver coil array 1
RF receive antenna 2
sensor node 3
digital amplifier 4
coil array housing 5
merger circuit 6
coil cable 7
coil plug 8
coil loop connection 10
digital network 11
digital network connection 12
common mode RF choke 13
detune circuit 14
matching circuit 15
digital amplifier signal acquisition circuit 16
low noise amplifier 17
Analog-to-Digital Converter 18
digital signal processor 19
digital controller 20
power management circuit 21
DC-DC converter 22
sensor 23
electrode/transducer 24
sensor signal acquisition circuit 25
reference electrode 26
first digital interface 27
second digital interface 28

The invention claimed is:

1. A magnetic resonance (MR) receiver coil array for an MR imaging system, the MR receiver coil array comprising:
a radio frequency (RF) receiver antenna,
a digital amplifier signal acquisition circuit, comprising a digital amplifier, wherein the digital amplifier signal acquisition circuit is configured to receive an MR signal from the RF receiver antenna and output a digital amplified MR signal, and
a sensor node comprising a sensor configured to gather measurement data other than MR signal acquisition, the sensor node further comprising a sensor signal acquisition circuit, wherein the sensor signal acquisition circuit is configured to digitize the gathered measurement data, wherein the sensor signal acquisition circuit is connected to the digital amplifier signal acquisition circuit via a first digital interface, wherein the sensor signal acquisition circuit is configured to link the digitized measurement data from the sensor signal acquisition circuit to the digital amplifier via the first digital interface, wherein the digital amplifier is configured to combine the digitized measurement data from the sensor signal acquisition circuit and the digital amplified MR signal, wherein
the MR receiver coil array comprises a merger circuit, wherein the merger circuit is configured to receive the combined digital amplified MR signal and the digitized measurement data from the digital amplifier by a second digital interface and to output the combined data to a back-end of the MR imaging system or a digital data processor.

2. The magnetic resonance (MR) receiver coil array according to claim 1, wherein the sensor has a common ground with the digital amplifier.

3. The magnetic resonance (MR) receiver coil array according to claim 1, wherein the sensor of the sensor node is configured to detect a physiological measured value of the patient to be examined.

4. The magnetic resonance (MR) receiver coil array according to claim 3, wherein the sensor is an electrophysiology sensor or a motion sensor.

5. The magnetic resonance (MR) receiver coil array according to claim 4, wherein the sensor is a capacitive electrophysiology sensor comprising a capacitive electrode.

6. The magnetic resonance (MR) receiver coil array according to claim 1, wherein the sensor is configured to measure a parameter of the environment in which the MR signal is gathered and/or to measure a parameter of the MR imaging system.

7. The magnetic resonance (MR) receiver coil array according to claim 6, wherein the measured value of the environment in which the MR signal is gathered is the temperature and/or vibrations of the MR imaging system and/or the measured value of the MR imaging system is an operational state of a component of the MR imaging system and/or a local magnetic field strength distribution or dynamics of the MR imaging system.

8. The magnetic resonance (MR) receiver coil array according to claim 1, wherein the MR receiver coil array comprises a plurality of RF receiver antennas with a plurality of digital amplifier signal acquisition circuits and a plurality of sensors with a plurality of sensor signal acquisition circuits, wherein the sensors, several sensors of the same type, or several sensors of different types, are configured to provide data to one or a plurality of digital amplifiers, wherein the digital amplifier is configured to collect the measurement data from multiple sensors of same or different type and to facilitate the transport of grouped sensory data to the merger circuit, wherein the merger circuit is configured to combine the data from the individual sensor types into data channels and to transfer data to the back-end of the MR imaging system as a single or multiple data channels.

9. The magnetic resonance (MR) receiver coil array according to claim 8, wherein the MR receiver coil array comprises different type of sensors, wherein the measurement data of the different type of sensors is transported to the merger circuit, wherein the merger circuit is configured to merge the measurement data from the different types of sensors per sensor type.

10. A method for acquiring measurement data with a sensor node in a magnetic resonance (MR) receiver coil array, the method comprising:

providing an MR receiver coil array according to claim 1 with a sensor node comprising a sensor configured to acquire measurement data other than MR signal acquisition, gathering of measurement data by the sensor wherein the data is stored in a local memory, digitizing the gathered measurement data by the sensor signal acquisition circuit, linking the data to the digital amplifier via the first digital interface, combining the measurement data and the digital amplified MR signal received by the RF receiver antenna in the digital amplifier, transferring the combined data to the merger circuit via the second digital interface, outputting the combined data to a back-end of an MR imaging system by the merger circuit.

11. The method according to claim 10, wherein the digital amplifier comprises a digital controller, wherein combining the measurement data and the digital amplified MR signal received by the RF receiver antenna in the digital amplifier comprises:

initiating a sensor measurement and acquiring sensor data by the digital controller, where the data can be temporally stored in a local memory, putting the measurement data in a communication layer of the digital amplifier in a time-interleaved fashion together with the digitized MR signal.

12. The method according to claim 10, wherein the MR receiver coil array comprises a plurality of RF receiver antennas with a plurality of digital amplifier signal acquisition circuits and a plurality of sensors with a plurality of sensor signal acquisition circuits, wherein the sensors, several sensors of the same type or several sensors of different types are configured to provide data to one or a plurality of digital amplifiers, and wherein combining the measurement data and the digital amplified MR signal received by the RF receiver antenna in the digital amplifier, comprises:

collecting the measurement data from multiple sensors of same or different type by the digital amplifier and facilitating the transport of grouped sensory data to the merger circuit, combining the data from the individual sensor types into data channels by the merger circuit and transferring data to the back-end of the MR imaging system as a single or multiple data channels.

13. The method according to claim 10, wherein the gathered sensory data is time aligned in each digital amplifier with main RF data.

14. A magnetic resonance (MR) imaging device comprising a MR receiver coil array according to claim 1.

15. A computer program comprising instructions that, when the program is executed by a processor, cause the processor to carry out, the method of claim 10.

* * * * *